(12) United States Patent
Tang et al.

(10) Patent No.: US 10,283,080 B2
(45) Date of Patent: May 7, 2019

(54) DISPLAY SCREEN ASSEMBLY, TERMINAL, AND METHOD FOR CONTROLLING DISPLAY SCREEN

(71) Applicant: Beijing Xiaomi Mobile Software Co., Ltd., Beijing (CN)

(72) Inventors: Lei Tang, Beijing (CN); Anyu Liu, Beijing (CN); Gang Wang, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 0 days.

(21) Appl. No.: 15/463,309

(22) Filed: Mar. 20, 2017

(65) Prior Publication Data

US 2017/0270894 A1    Sep. 21, 2017

(30) Foreign Application Priority Data

Mar. 21, 2016 (CN) .......................... 2016 1 0161640

(51) Int. Cl.
*G09G 3/3266* (2016.01)
*G09G 5/00* (2006.01)
(Continued)

(52) U.S. Cl.
CPC ........... *G09G 5/006* (2013.01); *G09G 3/2092* (2013.01); *G09G 3/3266* (2013.01);
(Continued)

(58) Field of Classification Search
CPC ............. G09G 3/3266; G09G 2310/04; G09G 2330/021
See application file for complete search history.

(56) References Cited

U.S. PATENT DOCUMENTS

2007/0040792 A1    2/2007    Kwag et al.
2009/0058782 A1*   3/2009    Watanabe ............ G09G 3/3614
                                                            345/94
(Continued)

FOREIGN PATENT DOCUMENTS

CN        1388509 A     1/2003
CN        1885379 A    12/2006
(Continued)

OTHER PUBLICATIONS

International Search Report for PCT Application No. PCT/CN2016/101647, dated Jan. 5, 2017.
(Continued)

*Primary Examiner* — Premal R Patel
(74) *Attorney, Agent, or Firm* — Finnegan, Henderson, Farabow, Garrett & Dunner LLP

(57) ABSTRACT

A display screen assembly includes: a gate driving circuit connected to n rows of gate lines, a display screen configured to include n pixel rows sequentially arranged, and a driving integrated circuit (IC) connected to the gate driving circuit via at least two signal lines. Each pixel row corresponds to a gate line of the n rows of gate lines. A first connection position at which a first signal line of the at least two signal lines and the gate driving circuit are connected corresponds to an i-th row of gate line. A second connection position at which a second signal line of the at least two signal lines and the gate driving circuit are connected corresponds to a j-th row of gate line. The at least two signal lines are configured to transmit frame initializing signals, and i, j, and n are positive integers.

19 Claims, 11 Drawing Sheets

(51) Int. Cl.
*G09G 5/373* (2006.01)
*G09G 3/20* (2006.01)
*G09G 3/36* (2006.01)
*G11C 19/28* (2006.01)

(52) U.S. Cl.
CPC ........... G09G 3/3677 (2013.01); G09G 5/373 (2013.01); *G09G 2300/0408* (2013.01); *G09G 2310/0202* (2013.01); *G09G 2310/0213* (2013.01); *G09G 2310/0224* (2013.01); *G09G 2310/0267* (2013.01); *G09G 2310/0286* (2013.01); *G09G 2310/04* (2013.01); *G09G 2320/08* (2013.01); *G09G 2330/021* (2013.01); *G11C 19/28* (2013.01)

(56) References Cited

U.S. PATENT DOCUMENTS

| | | |
|---|---|---|
| 2010/0045644 A1 | 2/2010 | Lee et al. |
| 2010/0220082 A1 | 9/2010 | Lin et al. |
| 2013/0328612 A1 | 12/2013 | Ofuji et al. |
| 2014/0152707 A1* | 6/2014 | Numata ............... G09G 3/3233 345/690 |
| 2015/0054800 A1* | 2/2015 | Kim .................... G09G 3/3225 345/204 |
| 2015/0116008 A1 | 4/2015 | Jang et al. |
| 2015/0154902 A1* | 6/2015 | Lee .......................... G09G 3/20 345/213 |
| 2015/0187295 A1* | 7/2015 | Sakamaki ............ G09G 3/3648 345/204 |
| 2015/0348508 A1 | 12/2015 | Her |
| 2016/0055829 A1* | 2/2016 | Lin ..................... G09G 3/3233 345/213 |
| 2016/0148556 A1* | 5/2016 | Tseng .................. G09G 3/3677 345/55 |
| 2016/0189659 A1* | 6/2016 | Park ..................... G11C 19/287 345/87 |
| 2016/0329014 A1* | 11/2016 | Lee ....................... G09G 3/2096 |
| 2016/0372078 A1* | 12/2016 | Song ....................... G09G 3/20 |
| 2017/0263204 A1* | 9/2017 | Tanaka ................. G09G 3/3677 |

FOREIGN PATENT DOCUMENTS

| | | |
|---|---|---|
| CN | 101268503 A | 9/2008 |
| CN | 101681682 A | 3/2010 |
| CN | 102474669 A | 5/2012 |
| CN | 103680439 A | 3/2014 |
| CN | 103680442 A | 3/2014 |
| CN | 104658466 A | 5/2015 |
| EP | 3113012 A2 | 1/2017 |
| GB | 2452279 A | 3/2009 |
| JP | 2005275008 A | 10/2005 |
| JP | 2011030081 A | 2/2011 |
| JP | 2011238337 A | 11/2011 |
| RU | 2 160 933 C2 | 12/2000 |
| WO | WO-2007/034364 A1 | 3/2007 |

OTHER PUBLICATIONS

Extended European Search Report issued in Application 17156606.0 mailed from the European Patent Office, dated Jul. 7, 2017.
English version of International Search Report issued in PCT/CN2016/101647, mailed from the State Intellectual Property Office of China dated Jan. 5, 2017.
Office Action in counterpart European Application No. 17 156 606.0-1210, dated Feb. 21, 2019.

* cited by examiner

DISPLAY SCREEN ASSEMBLY, TERMINAL, AND METHOD FOR CONTROLLING DISPLAY SCREEN

CROSS-REFERENCE TO RELATED APPLICATION

This application is based upon and claims priority to Chinese Patent Application 201610161640.X, filed on Mar. 21, 2016, the entire contents of which are incorporated herein by reference.

TECHNICAL FIELD

The present disclosure generally relates to the field of display screen, and more particularly, to a display screen assembly, a terminal, and a method for controlling a display screen.

BACKGROUND

A display screen is one of the most important input/output devices of a mobile terminal, and may consume a lot of power of the mobile terminal.

In order to reduce the power consumption of a display screen, the display screen can be switched between a screen-on state and a screen-off state. When the display screen is switched from the screen-off state to the screen-on state, a display area of the display screen will be operated for displaying.

SUMMARY

According to a first aspect of embodiments of the present disclosure, there is provided a display screen assembly including a gate driving circuit connected to n rows of gate lines, a display screen configured to include n pixel rows sequentially arranged, and a driving integrated circuit (IC) connected to the gate driving circuit via at least two signal lines. Each pixel row corresponds to a gate line of the n rows of gate lines. A first connection position at which a first signal line of the at least two signal lines and the gate driving circuit are connected corresponds to an i-th row of gate line. A second connection position at which a second signal line of the at least two signal lines and the gate driving circuit are connected corresponds to a j-th row of gate line. The at least two signal lines are configured to transmit frame initializing signals, and i, j, and n are positive integers.

According to a second aspect of embodiments of the present disclosure, there is provided a method for controlling a display screen assembly. The display screen assembly includes a display screen, a gate driving circuit including n rows of gate lines, and a driving integrated circuit (IC). The method includes, when the driving IC is in a first display mode, transmitting a first frame initializing signal to the gate driving circuit via a first signal line corresponding to an i-th row of gate line; after the gate driving circuit receives the first frame initializing signal, progressively scanning gate lines from the i-th row of gate line to an n-th row of gate line. The method further includes, when the driving IC is in a second display mode, transmitting a second frame initializing signal to the gate driving circuit via a second signal line corresponding to a j-th row of gate line; and after the gate driving circuit receives the second frame initializing signal, progressively scanning gate lines from the j-th row of gate line to the n-th row of gate line. The i, j, and n are positive integers.

According to a third aspect of embodiments of the present disclosure, there is provided a method for controlling a terminal including a processor and a display screen assembly. The display screen assembly includes a display screen, a gate driving circuit including n rows of gate lines, and a driving integrated circuit (IC). The method includes sending, by the processor, a mode selecting instruction to the driving IC; receiving, by the driving IC, the mode selecting instruction; determining, by the driving IC, a current display mode according to the mode selecting instruction; when the current display mode is a first display mode, transmitting, by the driving IC, a first frame initializing signal to the gate driving circuit via a first signal line corresponding to an i-th row of gate line; after receiving the first frame initializing signal, progressively scanning, by the gate driving circuit, gate lines from the i-th row of gate line to an n-th row of gate line; when the current display mode is a second display mode, transmitting, by the driving IC, a second frame initializing signal to the gate driving circuit via a second signal line corresponding to a j-th row of gate line; and after receiving the second frame initializing signal, progressively scanning, by the gate driving circuit, gate lines from the j-th row of gate line to the n-th row of gate line.

It is to be understood that both the foregoing general description and the following detailed description are exemplary and explanatory only and are not restrictive of the present disclosure, as claimed.

BRIEF DESCRIPTION OF THE DRAWINGS

The accompanying drawings, which are incorporated in and constitute a part of this specification, illustrate embodiments consistent with the present disclosure and, together with the description, serve to explain the principles of the present disclosure.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the present disclosure. Instead, they are merely exemplary apparatuses and methods consistent with aspects related to the present disclosure as recited in the appended claims.

While displaying information, it may be unnecessary for a display screen to display the information in a full screen mode. For example, to display an unread message on a mobile phone, only a partial display area in a display screen of the mobile phone is required. In order to reduce the power consumption of a display screen, the present disclosure provides a display screen assembly having multiple display modes. Each display mode may correspond to a display area having a different size. In this way, displaying in a full screen mode and in a partial screen mode may be achieved. Further, each partial screen mode may correspond to a display area having a different size.

Figure 1A:
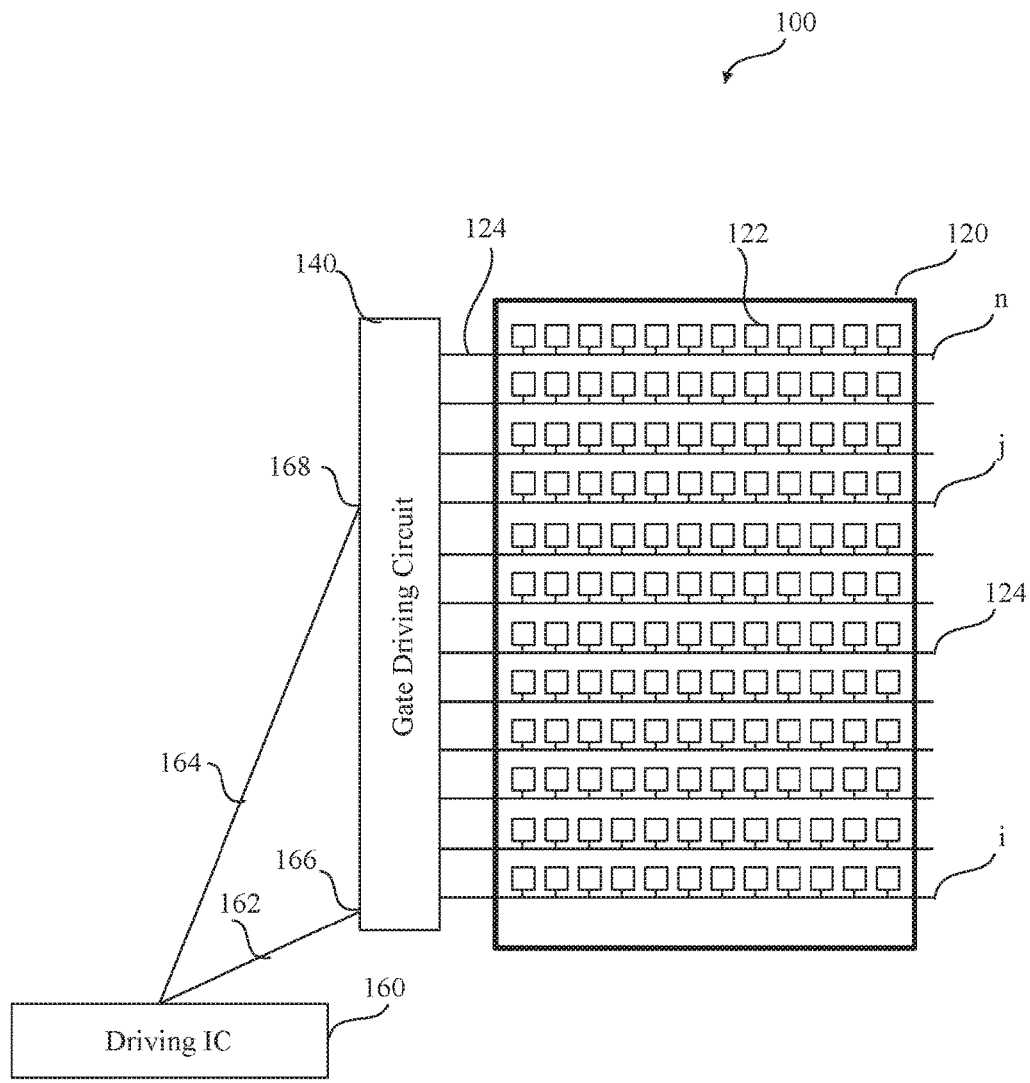
FIG. 1A is a schematic diagram of a display screen assembly, according to an exemplary embodiment.

FIG. 1A is a schematic diagram of a display screen assembly 100, according to an exemplary embodiment. The display screen assembly 100 includes a display screen 120, a gate driving circuit 140, and a driving integrated circuit (IC) 160.

The display screen 120 is configured to include n pixel rows 122 sequentially arranged, where n is an integer greater than or equal to 1. Each pixel row 122 corresponds to a gate line 124. In addition, each pixel row 122 may include m pixel units, where m is an integer greater than or equal to 1. For example, a display screen having a resolution of 320 by 240 includes 240 pixel rows 122 with each pixel row 122 including 320 pixel units.

The gate driving circuit 140 is configured to connect with n rows of gate lines 124. The gate driving circuit 140 is capable of scanning the n rows of gate lines 124 row by row. Each pixel row 122 is activated to be in an operation state when a corresponding gate line 124 receives a scan signal. The gate driving circuit 140 may be a gate driver on array (GOA). The gate driving circuit 140 may include a plurality of GOA units connected in series (not shown in FIG. 1A), and the GOA units and the gate lines 124 are in an one-to-one correspondence. For example, the i-th GOA unit is connected with the i-th row of gate line 124.

The driving IC 160 is configured to connect with the gate driving circuit 140 via at least two signal lines. The signal lines are signal lines for transmitting a frame initializing signal, also referred to as a start vertical (STV) signal, for indicating the start of displaying each image frame.

A connection position 166 between a first signal line 162 and the gate driving circuit 140 corresponds to the i-th row of gate line 124. In the exemplary embodiment, the i-th row of gate line 124 is the first row of gate line 124 in FIG. 1A.

A connection position 168 between a second signal line 164 and the gate driving circuit 140 corresponds to the j-th row of gate line 124. For example, in the exemplary embodiment, the j-th row of gate line is the $200^{th}$ row of gate line 124.

The driving IC 160 may have different display modes including a first display mode and a second display mode.

When the driving IC 160 is in the first display mode, an operating process of the display screen assembly 100 may include the following steps.

The driving IC 160 is configured to, in the first display mode, transmit a first frame initializing signal to the gate driving circuit 140 via the first signal line 162.

The gate driving circuit 140 is configured to, upon receiving the first frame initializing signal, progressively scan from the i-th row of gate line 124 to the n-th row of gate line 124.

Taking n=240 for example, the progressive scan from the i-th row of gate line 124 to the n-th row of gate line 124 includes: transmitting scan signals sequentially to the i-th row of gate line 124, the (i+1)-th row of gate line 124, the (i+2)-th row of gate line 124, . . . , the $240^{th}$ row of gate line 124 according to a first period. Each pixel row 122 is operated when a corresponding gate line 124 receives a scan signal.

Figure 1B:
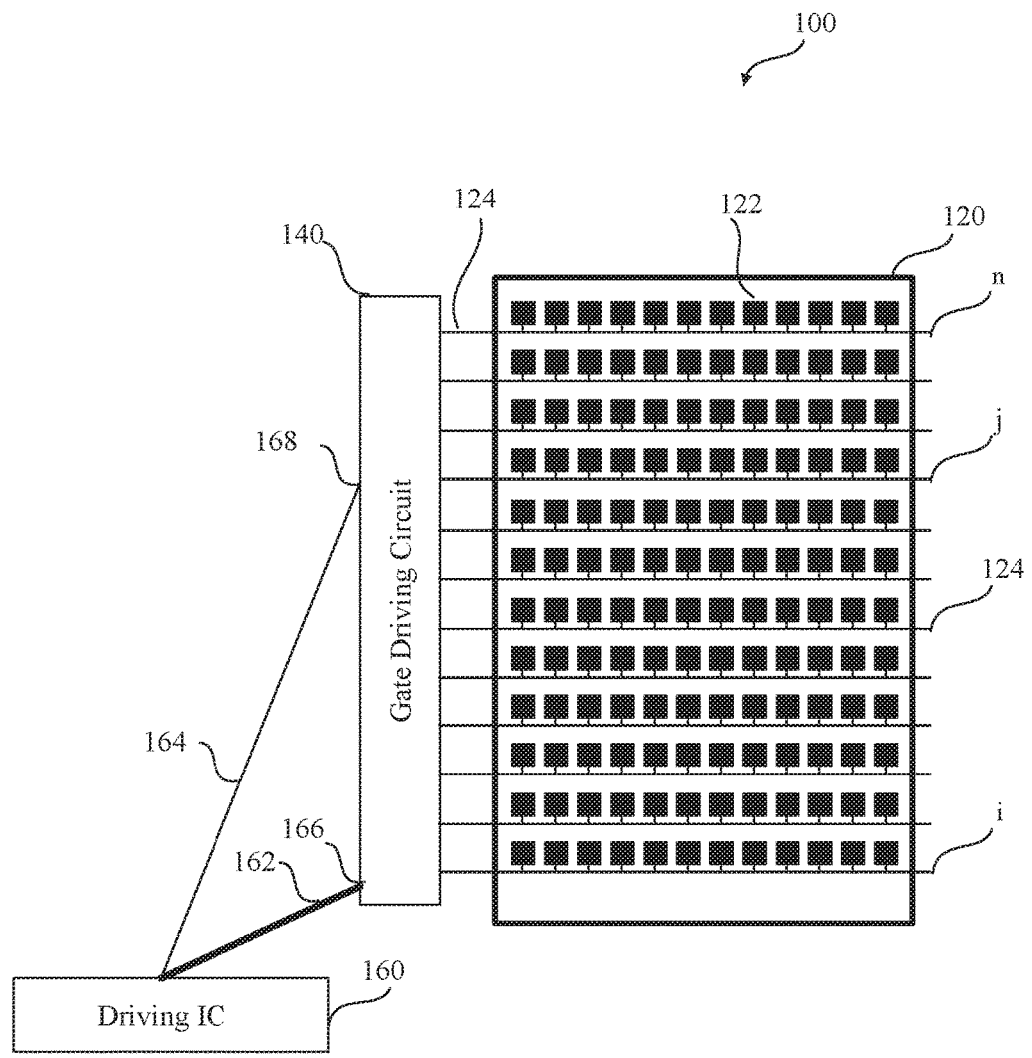
FIG. 1B is a schematic diagram of the display screen assembly of FIG. 1A in a first operating mode, according to an exemplary embodiment.

For example, when i=1, the gate driving circuit 140 progressively scans from the first row of gate line 124 to the $240^{th}$ row of gate line 124 to complete the display of one image frame. In this case, the display screen 120 performs a full screen display, and the display area has a size corresponding to the entire display screen, as illustrated in FIG. 1B.

Additionally, when the display screen 120 displays each image frame, the driving IC 160 transmits the first frame initializing signal to the gate driving circuit 140 once for the image frame.

When the driving IC 160 is in a second display mode, an operating process of the display screen assembly 100 may include the following steps.

The driving IC 160 is configured to, in the second display mode, transmit a second frame initializing signal to the gate driving circuit 140 via the second signal line 164.

The gate driving circuit 140 is configured to, upon receiving the second frame initializing signal, progressively scan from the j-th row of gate line 124 to the n-th row of gate line 124.

Taking n=240 for example, the progressive scan from the j-th row of gate line 124 to the n-th row of gate line 124 includes: transmitting scan signals sequentially to the j-th row of gate line 124, the (j+1)-th row of gate line 124, the (j+2)-th row of gate line 124, . . . , the $240^{th}$ row of gate line 124 according to a second period. Each pixel row is operated when a corresponding gate line receives a scan signal.

For example, when j=200, the gate driving circuit 140 progressively scans from the $200^{th}$ row of gate line 124 to the $240^{th}$ row of gate line 124 to complete the display of one image frame. In this case, the display screen 120 performs a partial screen display, and the display area has a size corresponding to an area from the $200^{th}$ row of pixels to the $240^{th}$ row of pixels, as illustrated in FIG. 1C.

Additionally, when the display screen 120 displays each image frame, the driving IC 160 transmits the second frame initializing signal to the gate driving circuit 140 once for the image frame.

In the exemplary embodiments, the display screen assembly 100 is provided with at least two signal lines for transmitting frame initializing signals. The connection position between the first signal line and the gate driving circuit corresponds to the i-th gate line, and the connection position between the second signal line and the gate driving circuit corresponds to the j-th gate line. As such, the driving IC is capable of progressively scanning from the i-th gate line as well as progressively scanning from the j-th gate line. Accordingly, a display area of the display screen may be controlled to operate in different display modes, and each display mode corresponds to a display area with a different size.

Figure 1C:
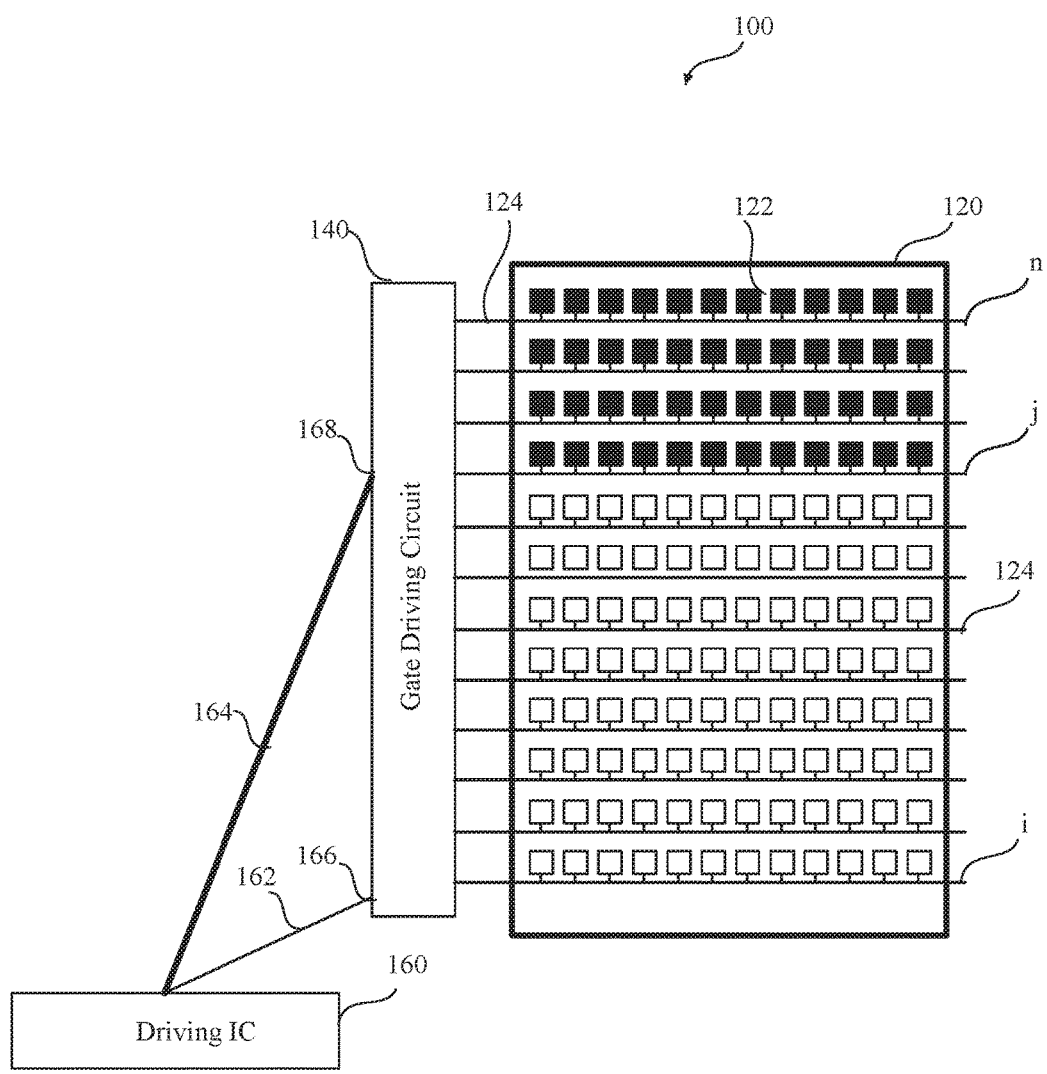
FIG. 1C is a schematic diagram of the display screen assembly of FIG. 1A in a second operating mode, according to an exemplary embodiment.

In the exemplary embodiments of FIGS. 1A-1C, two signal lines are used for transmitting the frame initialing signals. In some embodiments, three or more signal lines may be used. Each connection position at which a signal line is connected to the gate driving circuit corresponds to a different gate line.

Figure 2A:
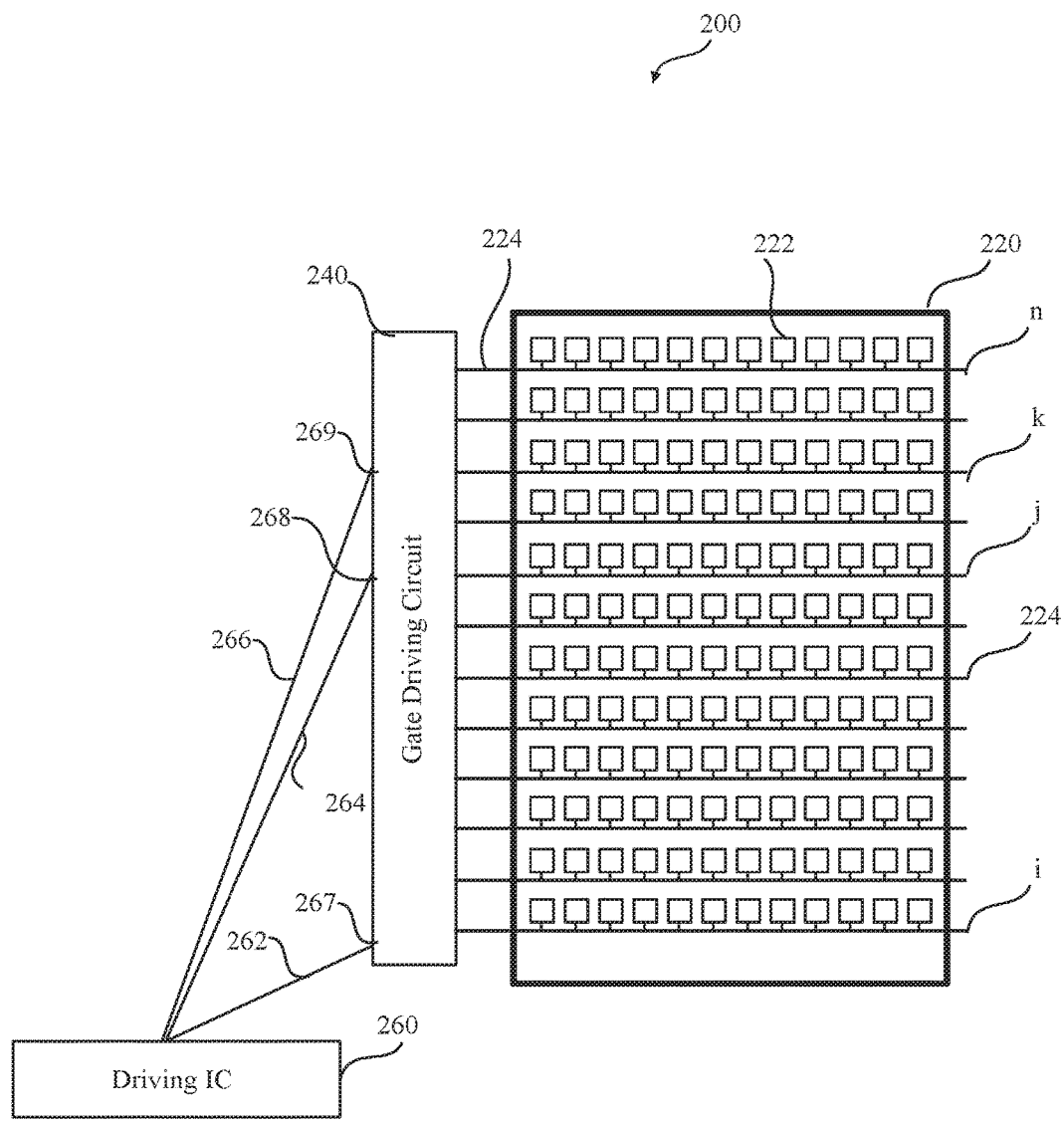
FIG. 2A is a schematic diagram of a display screen assembly, according to another exemplary embodiment.

FIG. 2A is a schematic diagram of a display screen assembly 200, according to another exemplary embodiment. In the display screen assembly 200, three signal lines are used for transmitting frame initializing signals. The display screen assembly 200 includes a display screen 220, a gate driving circuit 240, and a driving integrated circuit (IC) 260.

The display screen 220 is configured to include n pixel rows 222 sequentially arranged, where n is an integer greater than or equal to 1. Each pixel row 222 corresponds to a gate line 224. Additionally, each pixel row 222 may include m pixel units, where m is an integer greater than or equal to 1. For example, a display screen having a resolution of 1920 by 1080 includes 1080 pixel rows 222 with each pixel row 222 including 1920 pixel units.

The gate driving circuit 240 is configured to be connected with n rows of gate lines 224. The gate driving circuit 240 is capable of progressively scanning the n rows of gate lines 224 row by row. Each pixel row 222 is operated when a corresponding gate line 224 receives a scan signal. For example, the gate driving circuit 240 may be a gate driver on array (GOA). The gate driving circuit may include a plurality of GOA units connected in series (not shown in FIG. 2A), and the GOA units and the gate lines 224 are in a one-to-one correspondence. For example, the i-th GOA unit is connected with the i-th row of gate line 224.

In the exemplary embodiment, the driving IC 260 is configured to be connected with the gate driving circuit 240 via three signal lines. The signal lines are signal lines for transmitting a frame initializing signal, also referred to as a start vertical (STV) signal, for indicating the start of displaying each image frame.

A connection position 267 at which a first signal line 262 and the gate driving circuit 240 are connected corresponds to the i-th row of gate line 224. For example, in the exemplary embodiment, the i-th row of gate line is the first row of gate line 224.

A connection position 268 at which a second signal line 264 and the gate driving circuit 240 are connected corresponds to the j-th row of gate line 224. For example, in the exemplary embodiment, the j-th row of gate line is the $541^{st}$ row of gate line 224.

A connection position 269 at which a third signal line 266 and the gate driving circuit 240 are connected corresponds to the k-th row of gate line 224. For example, in the exemplary embodiment, the k-th row of gate line is the $1001^{st}$ row of gate line 224.

The driving IC 260 may have different display modes including a first display mode, a second display mode, and a third display mode.

When the driving IC 260 is in the first display mode, an operating process of the display screen assembly 200 may include the following steps.

The driving IC 260 is configured to, in the first display mode, transmit a first frame initializing signal to the gate driving circuit 240 via the first signal line 262.

The gate driving circuit 240 is configured to, upon receiving the first frame initializing signal, progressively scan from the i-th row of gate line 224 to the n-th row of gate line 224.

Taking n=1080 for example, the progressive scan from the i-th row of gate line 224 to the n-th row of gate line 224 includes: transmitting scan signals progressively to the i-th row of gate line 224, the (i+1)-th row of gate line 224, the (i+2)-th row of gate line 224, . . . , the $1080^{th}$ row of gate line 224 according to a first period. Each pixel row 222 is operated when a corresponding gate line 224 receives a scan signal.

Figure 2B:
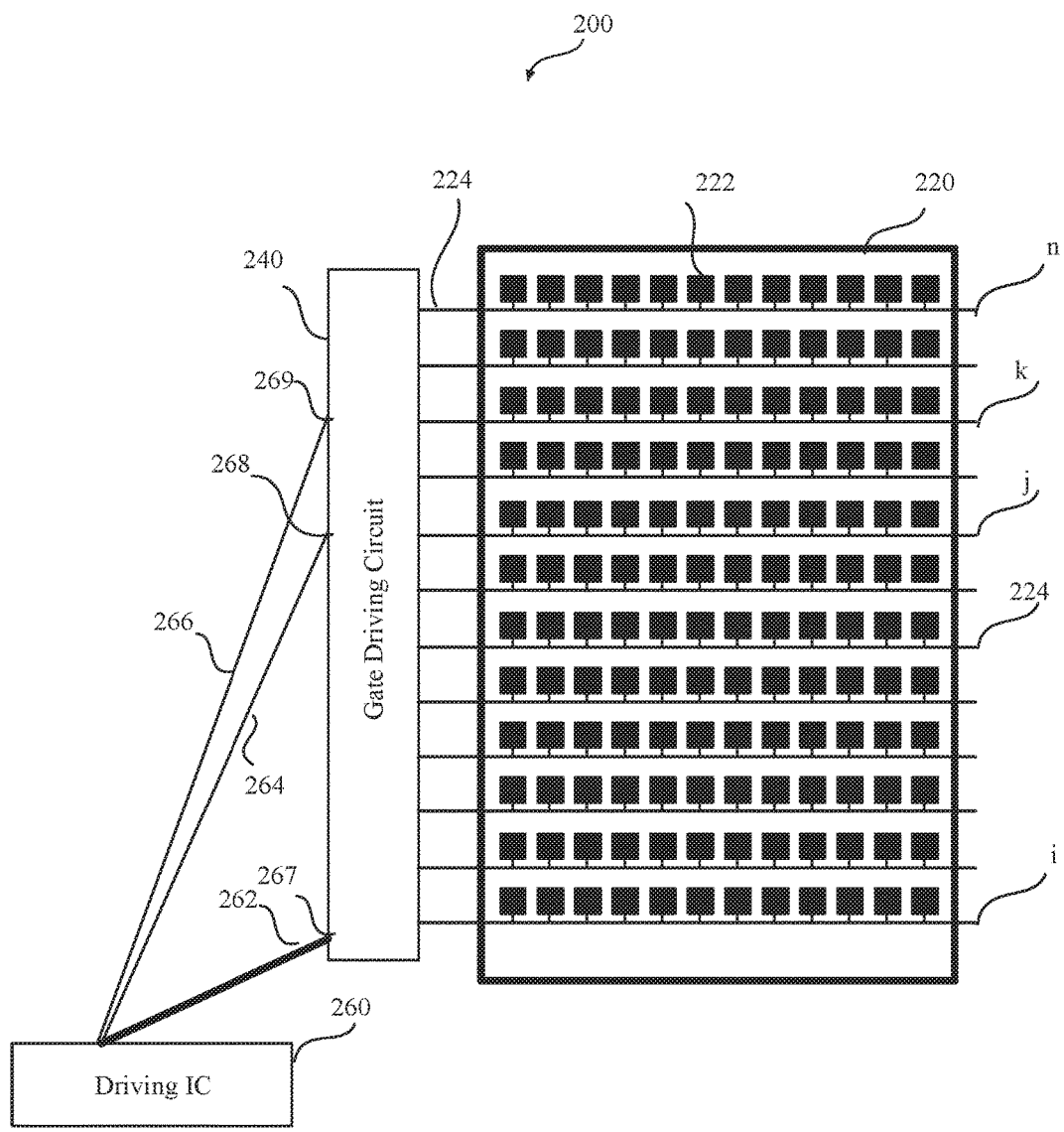
FIG. 2B is a schematic diagram of the display screen assembly of FIG. 2A in a first operating mode, according to an exemplary embodiment.

For example, when i=1, the gate driving circuit 240 progressively scans from the first row of gate line 224 to the $1080^{th}$ row of gate line 224 to complete the display of one image frame. In this case, the display screen 220 performs a full screen display, and the display area has a size corresponding to the entire display screen, as illustrated in FIG. 2B.

Additionally, when the display screen 220 displays each image frame, the driving IC 260 transmutes the first frame initializing signal to the gate driving circuit 240 once for the image frame.

When the driving IC 260 is in the second display mode, an operating process of the display screen assembly 200 may include the following steps.

The driving IC 260 is configured to, in the second display mode, transmit a second frame initializing signal to the gate driving circuit 240 via the second signal line 264.

The gate driving circuit 240 is configured to, upon receiving the second frame initializing signal, progressively scan from the j-th row of gate line 224 to the n-th row of gate line 224.

Taking n=1080 for example, the progressive scan from the j-th row of gate line 224 to the n-th row of gate line 224 includes: transmitting scan signals progressively to the j-th row of gate line 224, the (j+1)-th row of gate line 224, the (j+2)-th row of gate line 224, . . . , the $1080^{th}$ row of gate line 224 according to a second period. Each pixel row 222 is operated when a corresponding gate line 224 receives a scan signal.

Figure 2C:
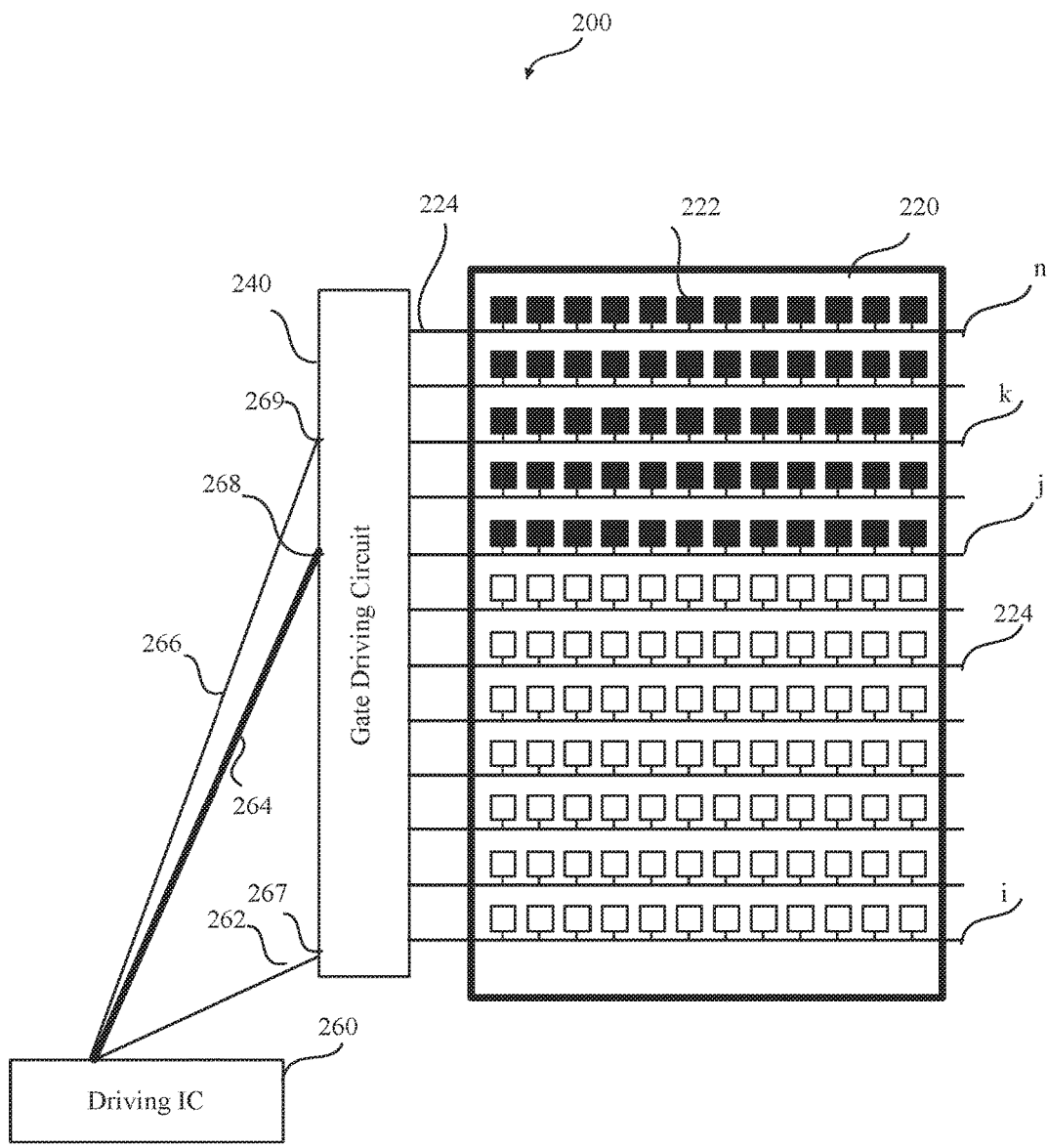
FIG. 2C is a schematic diagram of the display screen assembly of FIG. 2A in a second operating mode, according to an exemplary embodiment.

For example, when j=541, the gate driving circuit 240 progressively scans from the $541^{st}$ row of gate line 224 to the $1080^{th}$ row of gate line 224 to complete the display of one image frame. In this case, the display screen 220 performs a partial screen display, and the display area has a size corresponding to an area from the $541^{st}$ pixel row to the $1080^{th}$ pixel row, as illustrated in FIG. 2C.

Additionally, when the display screen 220 displays each image frame, the driving IC 260 transmits the second frame initializing signal to the gate driving circuit 240 once for the image frame.

When the driving IC 260 is in the third display mode, an operating process of the display screen assembly 200 may include the following steps.

The driving IC 260 is configured to, in the third display mode, transmit a third frame initializing signal to the gate driving circuit 240 via the third signal line 266.

The gate driving circuit 240 is configured to, upon receiving the third frame initializing signal, progressively scan from the k-th row of gate line 224 to the n-th row of gate line 224.

Taking n=1080 for example, the progressive scan from the k-th row of gate line 224 to the n-th row of gate line 224 includes: transmitting scan signals progressively to the k-th row of gate line 224, the (k+1)-th row of gate line 224, the (k+2)-th row of gate line 224, . . . , the $1080^{th}$ row of gate line 224 according to a third period. Each pixel row 222 is operated when a corresponding gate line 224 receives a scan signal.

Figure 2D:
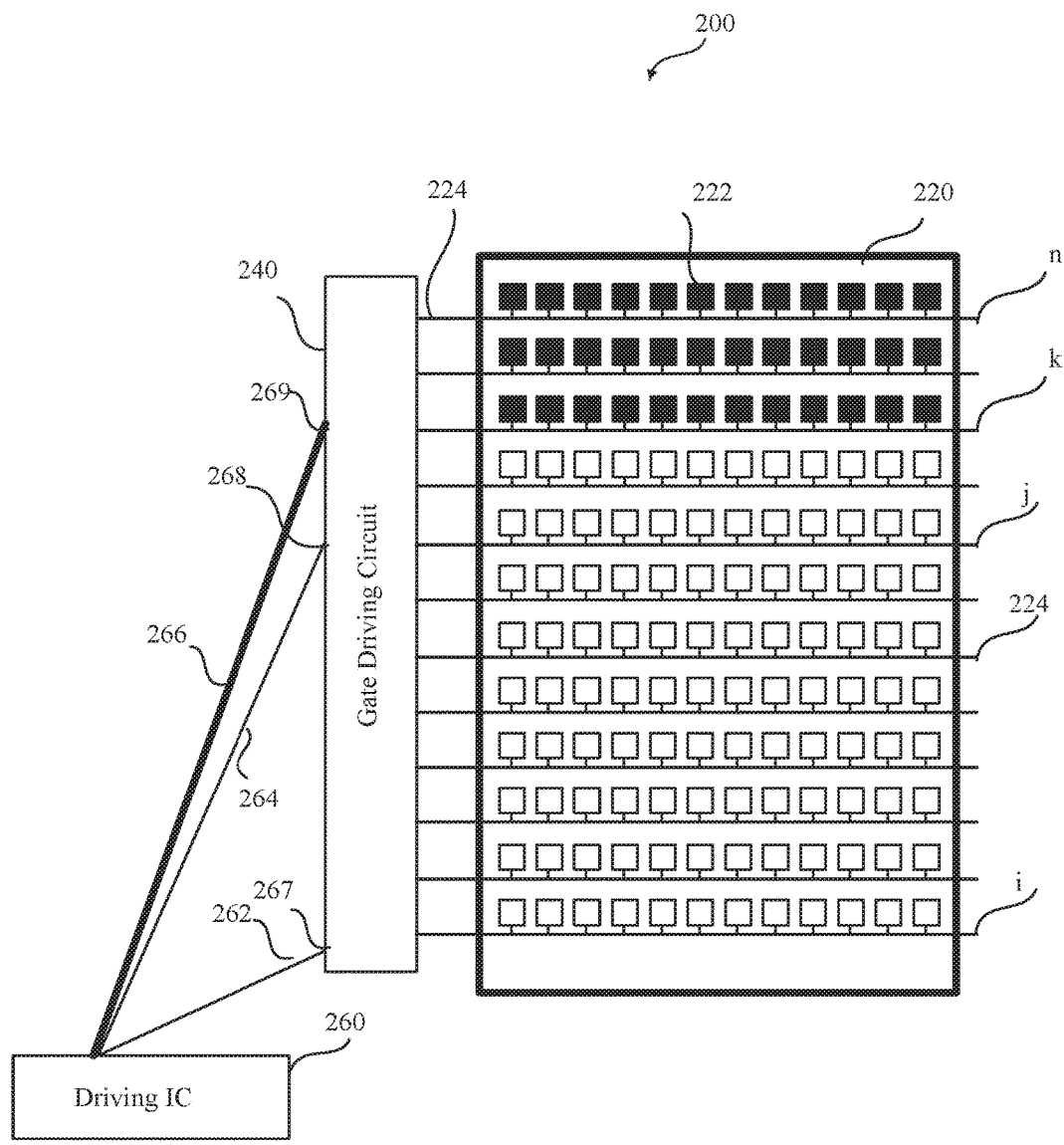
FIG. 2D is a schematic diagram of the display screen assembly of FIG. 2A in the second operating mode, according to another exemplary embodiment.

For example, when k=1001, the gate driving circuit 240 progressively scans from the $1001^{st}$ row of gate line 224 to the $1080^{th}$ row of gate line 224 to complete the display of one image frame. In this case, the display screen 220 performs a partial screen display, and the display area has a size corresponding to an area from the 1001$^{st}$ pixel row to the 1080$^{th}$ pixel row, as illustrated in FIG. 2D.

Additionally, when the display screen 220 displays each image frame, the driving IC 260 transmits the third frame initializing signal to the gate driving circuit 240 once for the image frame.

In the display screen assemblies 100 and 200, at least two signal lines for transmitting a frame initializing signal are provided. A connection position at which the first signal line and the gate driving circuit are connected corresponds to the i-th gate line. A connection position at which the second signal line and the gate driving circuit are connected corresponds to the j-th gate line. As such, the driving IC is capable of progressively scanning from the i-th gate line as well as progressively scanning from the j-th gate line. Accordingly, a display area of the display screen may be controlled to operate in different display modes, and each display mode corresponds to a display area with a different size.

Further, in the display screen assembly 200, three or more signal lines are provided. A connection position at which the first signal line and the gate driving circuit are connected corresponds to the first gate line. As such, the display screen may operate in a full screen mode or two partial screen modes with different sizes.

In the exemplary embodiments of FIG. 1A and FIG. 2A, the gate driving circuit is an integrated circuit. In some embodiments, the gate driving circuit may include two parts: an odd-row gate driving circuit and an even-row gate driving circuit.

Figure 3:
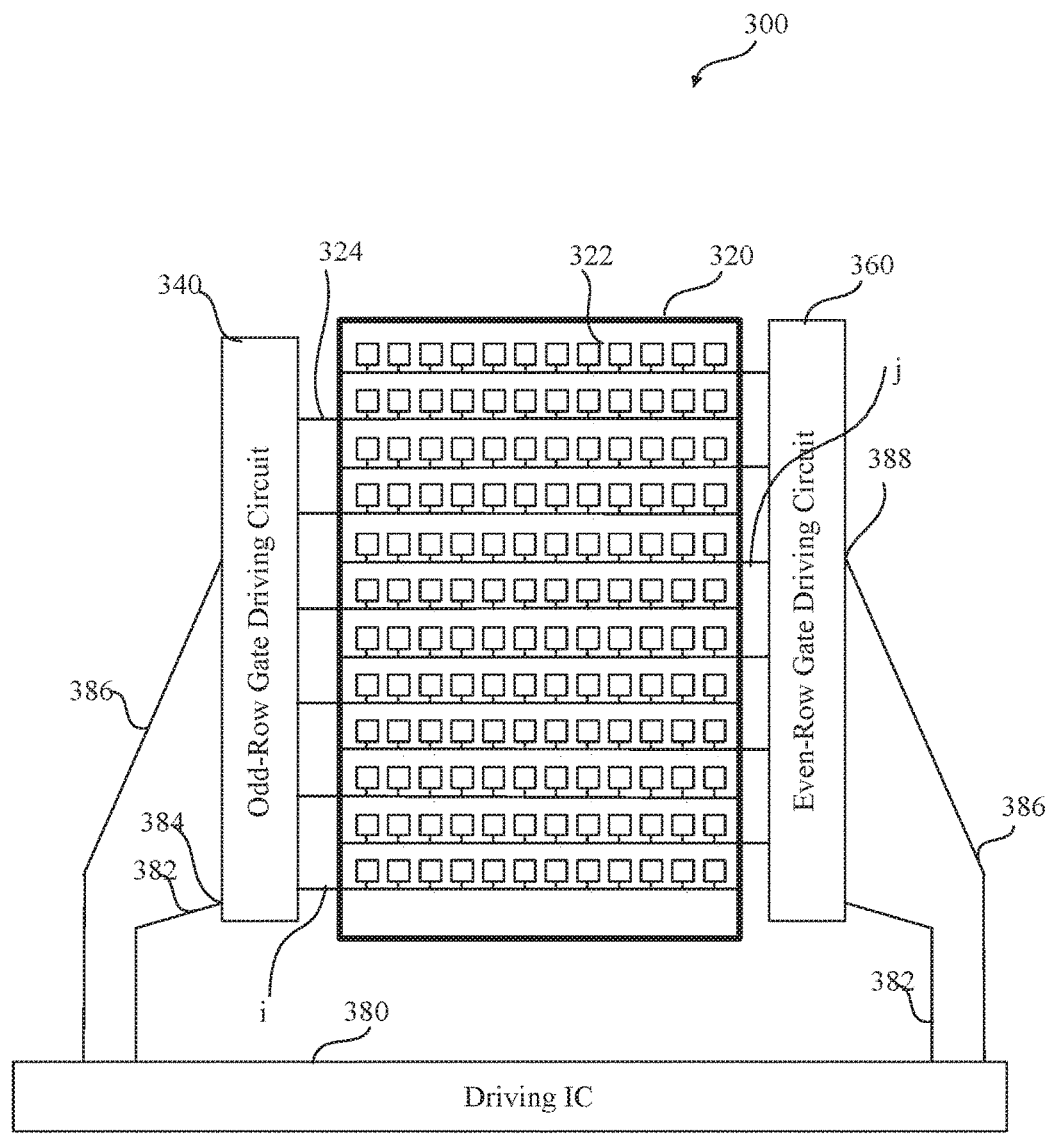
FIG. 3 is a schematic diagram of a display screen assembly, according to yet another exemplary embodiment.

FIG. 3 is a schematic diagram of a display screen assembly 300, according to another exemplary embodiment. The display screen assembly 300 includes a display screen 320, an odd-row gate driving circuit 340, an even-row gate driving circuit 360, and a driving integrated circuit (IC) 380.

The display screen 320 is configured to include n pixel rows 322 sequentially arranged, where n is an integer greater than or equal to 1. Each pixel row 322 corresponds to a gate line 324. Additionally, each pixel row 322 may include m pixel units, where m is an integer greater than or equal to 1. For example, a display screen having a resolution of 1920 by 1080 includes 1080 pixel rows 322 with each pixel row 322 including 1920 pixel units.

The odd-row gate driving circuit 340 is configured to be connected with odd rows of gate lines in the n rows of gate lines 324, i.e., the first row of gate line, the third row of gate line, the fifth row of gate line, the seventh row of gate line, . . . , the (n−1)-th row of gate line (assuming that n is an even number).

The even-row gate driving circuit 360 is configured to be connected with even rows of gate lines in the n rows of gate lines 324, i.e., the second row of gate line, the fourth row of gate line, the sixth row of gate line, the eighth row of gate line, . . . , the n-th row of gate line (assuming that n is an even number).

The odd-row gate driving circuit 340 is capable of progressively scanning odd rows of gate lines in the n rows of gate lines 324, and the even-row gate driving circuit 360 is capable of progressively scanning even rows of gate lines in the n rows of gate lines 324. The odd-row gate driving circuit 340 and the even-row gate driving circuit 360 coordinate to progressively scan from the first row of gate line 324 to the n-th row of gate line 324. Each pixel row 322 is operated when a corresponding gate line 324 receives a scan signal. Additionally, the odd-row gate driving circuit 340 and the even-row gate driving circuit 360 may be gate driver on arrays (GOA). The gate driving circuit (comprising the odd-row gate driving circuit 340 and the even-row gate driving circuit 360) may include a plurality of GOA units connected in series (not shown in FIG. 3), and the GOA units and the gate lines 324 are in an one-to-one correspondence. For example, the i-th GOA unit is connected with the i-th row of gate line 324. The odd-row gate driving circuit 340 includes odd GOA units connected in series, and the even-row gate driving circuit 360 includes even GOA units connected in series.

The driving IC 380 is connected with the gate driving circuit via two sets of signal lines (i.e., a first set of signal lines 382 and a second set of signal lines 386). Each set of signal lines includes two signal lines, wherein one signal line is connected with the odd-row gate driving circuit 340, and the other signal line is connected with the even-row gate driving circuit 360. The signal lines are signal lines for transmitting a frame initializing signal, also referred to as a start vertical (STV) signal, for indicating the start of displaying each image frame.

A connection position 384 at which the signal line 382 and the gate driving circuit (e.g., the odd-row gate driving circuit 340) are connected corresponds to the i-th row of gate line 324.

A connection position 388 at which the signal line 386 and the gate driving circuit (e.g., the even-row gate driving circuit 360) are connected, corresponds to the j-th row of gate line 324.

Additionally, the driving IC 380 may include two operating modes: a first display mode and a second display mode.

When the driving IC 380 is in the first display mode, an operating process of the display screen assembly 300 may include the following steps.

The driving IC 380 is configured to, in the first display mode, transmit a first frame initializing signal to the odd-row gate driving circuit 340 and the even-row gate driving circuit 360 via the first set of signal lines 382.

The odd-row gate driving circuit 340 and the even-row gate driving circuit 360 are configured to, upon receiving the first frame initializing signal, progressively scan from the i-th row of gate line 324 to the n-th row of gate line 324.

Additionally, when the display screen 320 displays each image frame, the driving IC 380 transmits the first frame initializing signal to the odd-row gate driving circuit 340 and the even-row gate driving circuit 360 once for the each image frame.

When the driving IC 380 is in the second display mode, an operating process of the display screen assembly 300 may include the following steps.

The driving IC 380 is configured to, in the second display mode, transmit a second frame initializing signal to the odd-row gate driving circuit 340 and the even-row gate driving circuit 360 via the second set of signal lines 386.

The odd-row gate driving circuit 340 and the even-row gate driving circuit 360 are configured to, upon receiving the second frame initializing signal, progressively scan from the j-th row of gate line 324 to the n-th row of gate line 324.

In the display screen assembly 300, at least two signal lines for transmitting the frame initializing signal are provided. A connection position at which a first signal line and the gate driving circuit are connected corresponds to the i-th gate line. A connection position at which a second signal line and the gate driving circuit are connected corresponds to the j-th gate line. As such, the driving IC is capable of progressively scanning from the i-th gate line as well as progressively scanning from the j-th gate line. Accordingly, a display area of the display screen may be controlled to operate in different display modes, and each display mode corresponds to a display area with a different size.

Figure 4:
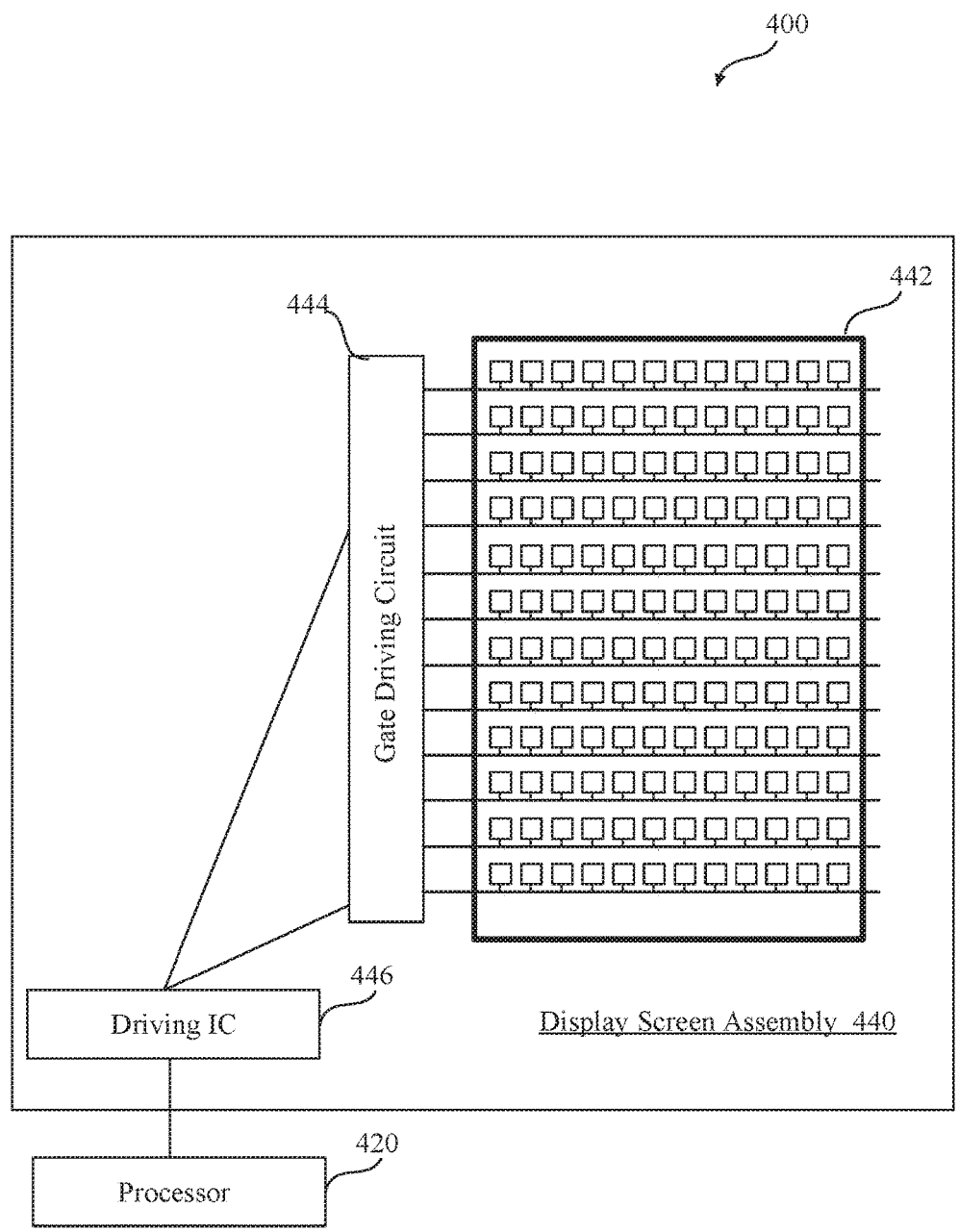
FIG. 4 is a schematic diagram of a terminal, according to an exemplary embodiment.

FIG. 4 is a schematic diagram of a terminal 400, according to an exemplary embodiment. The terminal 400 includes a processor 420 and a display screen assembly 440.

The display screen assembly 440 may be one of the display screen assemblies 100, 200, or 300. The display screen assembly 440 includes a display screen 442, a gate driving circuit 444, and a driving IC 446.

The processor 420 is configured to be connected with the driving IC 446 in the display screen assembly 440.

Figure 5:
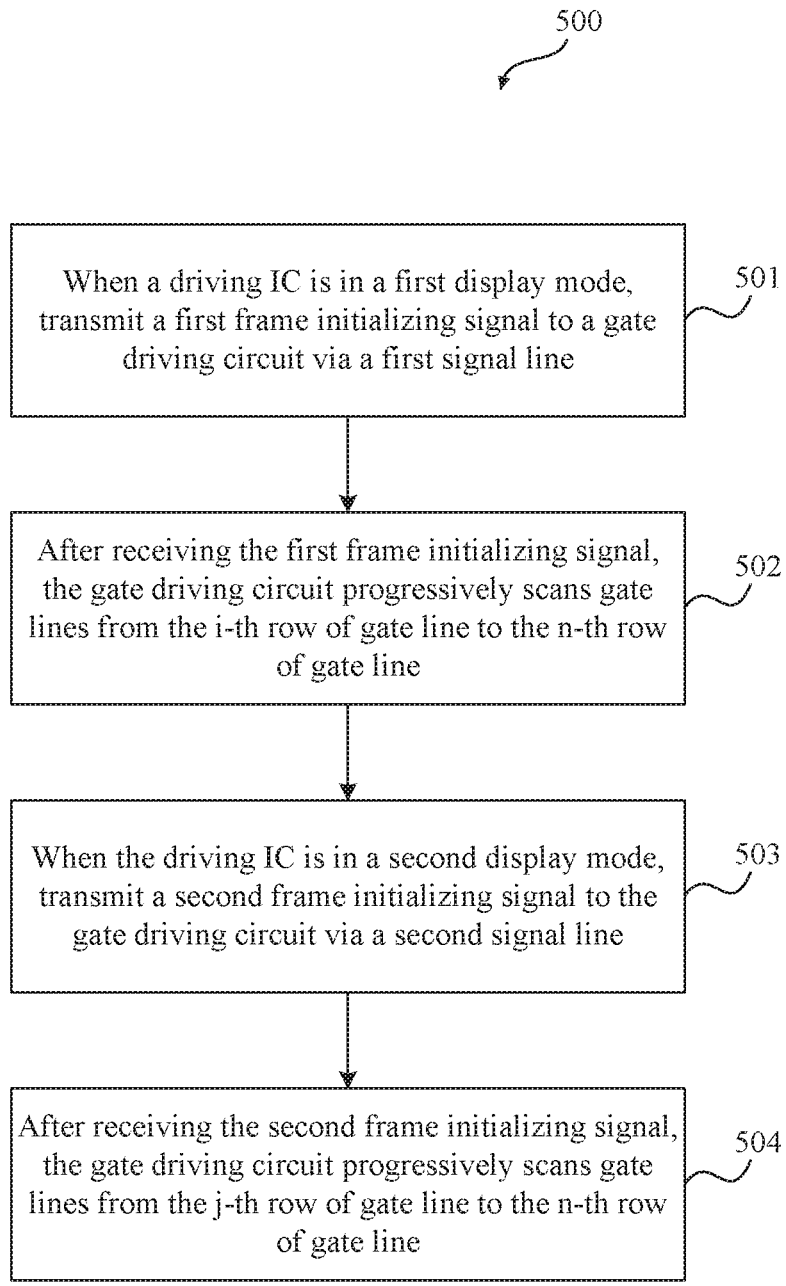
FIG. 5 is a flow chart of a method for controlling a display screen assembly, according to an exemplary embodiment.

FIG. 5 is a flow chart of a method 500 for controlling a display screen assembly, according to an exemplary embodiment. The method 500 may be applicable to the display screen assemblies 100, 200, and 300. The method 500 includes the following steps.

In step 501, when a driving IC is in a first display mode, a first frame initializing signal is transmitted to a gate driving circuit via a first signal line.

In some embodiments, when the driving IC is in the first display mode, the first frame initializing signal is transmitted periodically to the gate driving circuit via the first signal line according to a first period. The first period is proportional to a first parameter. The first parameter may be a total number of gate lines between the i-th row of gate line and the n-th row of gate line.

In step 502, after receiving the first frame initializing signal, the gate driving circuit progressively scans the gate lines from the i-th row of gate line to the n-th row of gate line. Each pixel row is operated when a corresponding gate line receives a scan signal.

In step 503, when the driving IC is in a second display mode, a second frame initializing signal is transmitted to the gate driving circuit via a second signal line.

In some embodiments, when the driving IC is in the second display mode, the second frame initializing signal is periodically transmitted to the gate driving circuit via the second signal line according to a second period. The second period is proportional to a second parameter. The second parameter may be a total number of gate lines between the j-th row of gate line and the n-th row of gate line.

In step 504, after receiving the second frame initializing signal, the gate driving circuit progressively scans gate lines from the j-th row of gate line to the n-th row of gate line.

In the present disclosure, a timing for performing the steps 503 and 504 and a timing for performing the steps 501 and 502 are not limited and may be determined according to a current display mode of the driving IC. For example, the steps 503 and 504 may be performed prior to the steps 501 and 502.

In the method 500 for controlling a display screen, when the driving IC is in the first display mode, the first frame initializing signal is transmitted to the gate driving circuit via the first signal line. After receiving the first frame initializing signal, the gate driving circuit progressively scans gate lines from the i-th row of gate line to the n-th row of gate line. When the driving IC is in the second display mode, the second frame initializing signal is transmitted to the gate driving circuit via the second signal line. After receiving the second frame initializing signal, the gate driving circuit progressively scans gate lines from the j-th row of gate line to the n-th row of gate line. Accordingly, a display area of the display screen may be controlled to operate in different display modes, and each display mode corresponds to a display area with a different size.

Figure 6:
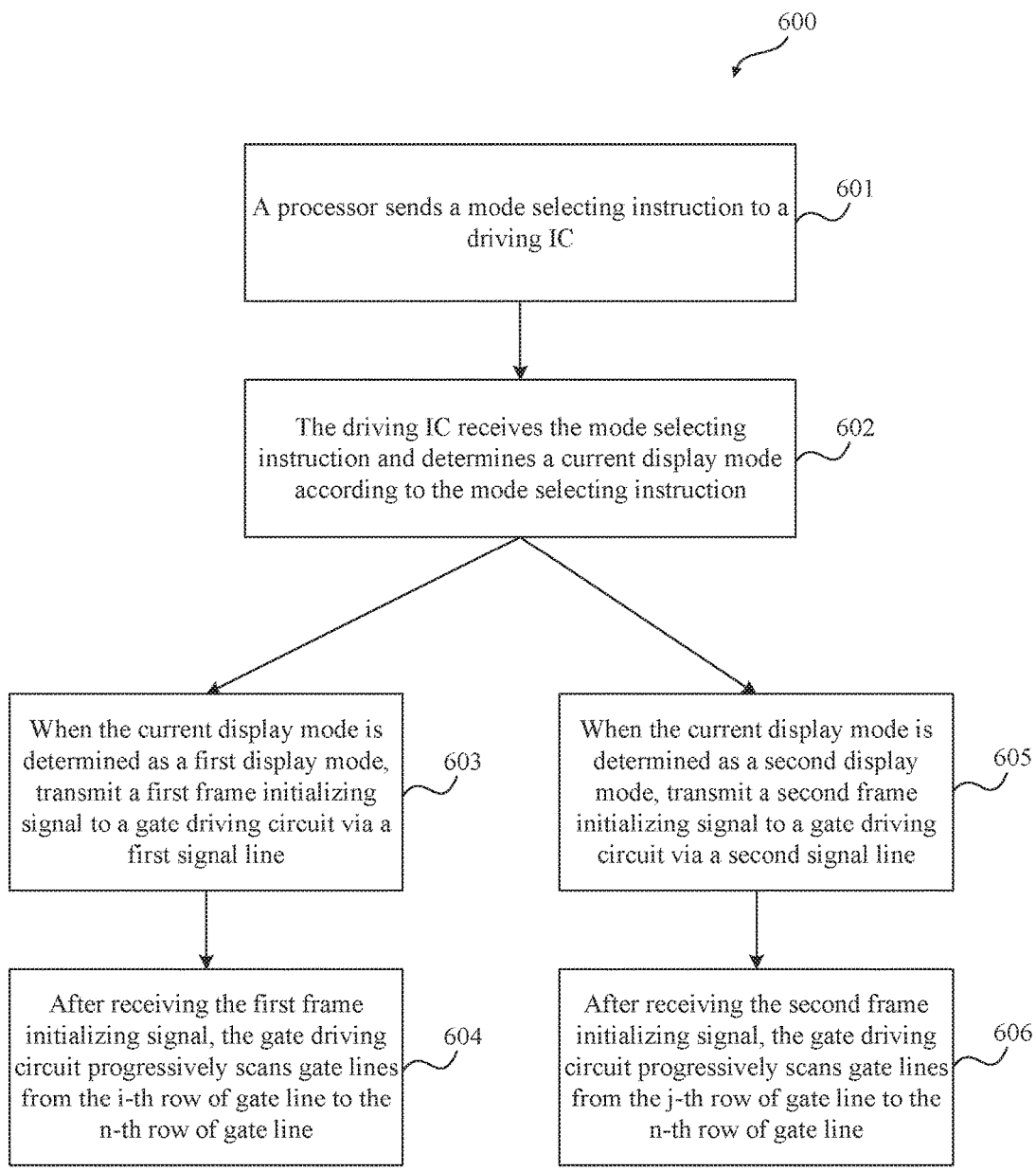
FIG. 6 is a flow chart of a method for controlling a display screen assembly, according to another exemplary embodiment.

FIG. 6 is a flow chart of a method 600 for controlling a display screen assembly, according to another exemplary embodiment. The method 600 may be applicable to a terminal, for example the terminal 400 shown in FIG. 4. The method 600 includes the following steps.

In step 601, a processor sends a mode selecting instruction to a driving IC.

The processor sends the mode selecting instruction to the driving IC according to a current operating state of the processor. The mode selecting instruction is configured to instruct the driving IC to select one of at least two display modes.

For example, when the current operating state is a state of playing video, a mode selecting instruction for selecting the first display mode is sent to the driving IC. The first display mode may be a full screen display mode.

For another example, when the current operating state is a state of displaying an unread message, a mode selecting instruction for selecting the second display mode is sent to the driving IC. The second display mode may be a partial screen display mode.

In step 602, the driving IC receives the mode selecting instruction and determines a current display mode according to the mode selecting instruction.

In step 603, when the current display mode is determined as a first display mode, a first frame initializing signal is transmitted to a gate driving circuit via a first signal line.

In some embodiments, when the driving IC is in the first display mode, the first frame initializing signal is transmitted periodically to the gate driving circuit via the first signal line according to a first period. The first period is proportional to a first parameter, and the first parameter may be a total number of gate lines between the i-th row of gate line and the n-th row of gate line.

In step 604, after receiving the first frame initializing signal, the gate driving circuit progressively scans gate lines from the i-th row of gate line to the n-th row of gate line. Each pixel row is operated when a corresponding gate line receives a scan signal.

In step 605, when the current display mode is determined as a second display mode, a second frame initializing signal is transmitted to the gate driving circuit via a second signal line.

In some embodiments, when the driving IC is in the second display mode, the second frame initializing signal is periodically transmitted to the gate driving circuit via the second signal line according to a second period. The second period is proportional to a second parameter, and the second parameter may be a total number of gate lines between the j-th row of gate line and the n-th row of gate line.

In step 606, after receiving the second frame initializing signal, the gate driving circuit progressively scans gate lines from the j-th row of gate line to the n-th row of gate line.

In the present disclosure, a timing for performing the steps 605 and 606 and a timing for performing the steps 603 and 604 are not limited and are determined according to a current display mode of the driving IC. For example, the steps 605 and 606 may be performed prior to the steps 603 and 604.

In the method 600 for controlling a display screen, when the driving IC is in a first display mode, a first frame initializing signal is sent to the gate driving circuit via the first signal line. After the gate driving circuit receives the first frame initializing signal, the gate driving circuit progressively scans gate lines from the i-th row of gate line to the n-th row of gate line. When the driving IC is in a second display mode a second frame initializing signal is sent to the gate driving circuit via the second signal line. After the gate driving circuit receives the second frame initializing signal, the gate driving circuit progressively scans gate lines from the j-th row of gate line to the n-th row of gate line. Accordingly, a display area of the display screen may be controlled to operate in different display modes, and each display mode corresponds to a display area with a different size.

Other embodiments of the present disclosure will be apparent to those skilled in the art from consideration of the specification and practice of the present disclosure disclosed here. This application is intended to cover any variations, uses, or adaptations of the present disclosure following the general principles thereof and including such departures from the present disclosure as common knowledge within known or customary practice in the art. It is intended that the specification and examples be considered as exemplary only, with a true scope and spirit of the present disclosure being indicated by the following claims.

It will be appreciated that the present disclosure is not limited to the exact construction that has been described above and illustrated in the accompanying drawings, and that various modifications and changes can be made without departing from the scope thereof. It is intended that the scope of the present disclosure only be limited by the appended claims.

What is claimed is:

1. A display screen assembly, comprising:
   a gate driving circuit connected to n rows of gate lines;
   a display screen configured to include n pixel rows sequentially arranged, each pixel row corresponding to a gate line of the n rows of gate lines; and
   a driving IC connected to the gate driving circuit via at least two signal lines, wherein:
      a first signal line of the at least two signal lines is directly connected to the gate driving circuit at a first connection position, the first connection position corresponding to an i-th row of gate line; and a second signal line of the at least two signal lines is directly connected to the gate driving circuit at a second connection position, the second connection position corresponding to a j-th row of gate line;
      the at least two signal lines are configured to transmit frame initializing signals;
      the driving IC is configured to, in a first display mode, transmit a first frame initializing signal to the gate driving circuit via the first signal line;
      the gate driving circuit is configured to, upon receiving the first frame initializing signal, progressively scan gate lines from the i-th row of gate line to the n-th row of gate line;
      the driving IC is configured to, in a second display mode, transmit a second frame initializing signal to the gate driving circuit via the second signal line;
      the gate driving circuit is configured to, upon receiving the second frame initializing signal, progressively scan gate lines from the j-th row of gate line to the n-th row of gate line; and
      i, j, and n are positive integers.

2. The display screen assembly according to claim 1, wherein:
   the driving IC is further configured to, in the first display mode, periodically transmit the first frame initializing signal to the gate driving circuit via the first signal line according to a first period; and
   the driving IC is further configured to, in the second display mode, periodically transmit the second frame initializing signal to the gate driving circuit via the second signal line according to a second period,
   wherein:
      the first period is proportional to a first parameter, the first parameter being a total number of gate lines between the i-th row of gate line and the n-th row of gate line; and
      the second period is proportional to a second parameter, the second parameter being a total number of gate lines between the j-th row of gate line and the n-th row of gate line.

3. The display screen assembly according to claim 1, wherein the gate driving circuit comprises:
   an odd-row gate driving circuit and an even-row gate driving circuit;
   the odd-row gate driving circuit is connected with odd rows of gate lines in the n rows of gate lines; and
   the even-row gate driving circuit is connected with even rows of gate lines in the n rows of gate lines.

4. The display screen assembly according to claim 3, wherein the at least two signal lines include a first set of signal lines and a second set of signal lines, each set of signal lines including one signal line connected to the odd-row gate driving circuit and one signal line connected to the even-row gate driving circuit.

5. The display screen assembly according to claim 1, wherein:
   the gate driving circuit is a gate driver on array (GOA);
   the GOA includes a plurality of GOA units connected in series; and
   the GOA units and the n rows of gate lines are in an one-to-one correspondence.

6. The display screen assembly according to claim 1, wherein i=1 and j>1.

7. The display screen assembly according to claim 1, wherein the at least two signal lines include three or more signal lines, each signal line forming a corresponding connection position at which the signal line is connected to the gate driving circuit, and corresponding to a different gate line.

8. A terminal, comprising:
   a display screen assembly according to claim 1; and
   a processor connected with the driving IC in the display screen assembly.

9. A method for controlling a display screen assembly, the display screen assembly including a display screen, a gate driving circuit including n rows of gate lines, and a driving integrated circuit (IC), the method comprising:
   when the driving IC is in a first display mode, transmitting a first frame initializing signal to the gate driving circuit via a first signal line, the first signal line being directly connected to the gate driving circuit at a first connection position corresponding to an i-th row of gate line;
   after the gate driving circuit receives the first frame initializing signal, progressively scanning gate lines from the i-th row of gate line to an n-th row of gate line;
   when the driving IC is in a second display mode, transmitting a second frame initializing signal to the gate driving circuit via a second signal line, the second signal line being directly connected to the gate driving circuit at a second connection position corresponding to a j-th row of gate line; and
   after the gate driving circuit receives the second frame initializing signal, progressively scanning gate lines from the j-th row of gate line to the n-th row of gate line,
   wherein i, j, and n are positive integers.

10. The method according to claim 9, wherein the transmitting the first frame initializing signal to the gate driving circuit via the first signal line comprises:

periodically transmitting the first frame initializing signal to the gate driving circuit via the first signal line according to a first period, wherein the first period is proportional to a first parameter, the first parameter being a total number of gate lines between the i-th row of gate line and the n-th row of gate line.

11. The method according to claim 10, wherein the transmitting the second frame initialing signal to the gate driving circuit via the second signal line comprises:

periodically transmitting the second frame initializing signal to the gate driving circuit via the second signal line according to a second period, wherein the second period is proportional to a second parameter, the second parameter being a total number of gate lines between the j-th row of gate line and the n-th row of gate line.

12. The method according to claim 9, further comprising: receiving a mode selecting instruction; and determining a current display mode according to the mode selecting instruction.

13. The method according to claim 9, wherein the gate driving circuit comprises:

an odd-row gate driving circuit and an even-row gate driving circuit;

the odd-row gate driving circuit is connected with odd rows of gate lines in the n rows of gate lines; and the even-row gate driving circuit is connected with even rows of gate lines in the n rows of gate lines.

14. The method according to claim 13, wherein the at least two signal lines include a first set of signal lines and a second set of signal lines, each set of signal lines including one signal line connected to the odd-row gate driving circuit and one signal line connected to the even-row gate driving circuit.

15. A method for controlling a terminal including a processor and a display screen assembly, the display screen assembly including a display screen, a gate driving circuit including n rows of gate lines, and a driving integrated circuit (IC), the method comprising:

sending, by the processor, a mode selecting instruction to the driving IC;

receiving, by the driving IC, the mode selecting instruction;

determining, by the driving IC, a current display mode according to the mode selecting instruction;

when the current display mode is a first display mode, transmitting, by the driving IC, a first frame initializing signal to the gate driving circuit via a first signal line, the first signal line being directly connected to the gate driving circuit at a first connection position corresponding to an i-th row of gate line;

after receiving the first frame initializing signal, progressively scanning, by the gate driving circuit, gate lines from the i-th row of gate line to an n-th row of gate line;

when the current display mode is a second display mode, transmitting, by the driving IC, a second frame initializing signal to the gate driving circuit via a second signal line, the second signal line being directly connected to the gate driving circuit at a second connection position corresponding to a j-th row of gate line; after receiving the second frame initializing signal, progressively scanning, by the gate driving circuit, gate lines from the j-th row of gate line to the n-th row of gate line; and wherein i, j, and n are positive integers.

16. The method according to claim 15, wherein the transmitting, by the driving IC, the first frame initializing signal to the gate driving circuit via the first signal line comprises:

periodically transmitting the first frame initializing signal to the gate driving circuit via the first signal line according to a first period, wherein the first period is proportional to a first parameter, the first parameter being a total number of gate lines between the i-th row of gate line and the n-th row of gate line.

17. The method according to claim 16, wherein the transmitting, by the driving IC, the second frame initialing signal to the gate driving circuit via the second signal line comprises:

periodically transmitting the second frame initializing signal to the gate driving circuit via the second signal line according to a second period, wherein the second period is proportional to a second parameter, the second parameter being a total number of gate lines between the j-th row of gate line and the n-th row of gate line.

18. The method according to claim 15, wherein the gate driving circuit comprises:

an odd-row gate driving circuit and an even-row gate driving circuit;

the odd-row gate driving circuit is connected with odd rows of gate lines in the n rows of gate lines; and the even-row gate driving circuit is connected with even rows of gate lines in the n rows of gate lines.

19. The method according to claim 18, wherein the at least two signal lines include a first set of signal lines and a second set of signal lines, each set of signal lines including one signal line connected to the odd-row gate driving circuit and one signal line connected to the even-row gate driving circuit.

* * * * *